United States Patent [19]

Burn

[11] Patent Number: 4,879,261

[45] Date of Patent: Nov. 7, 1989

[54] LOW DIELECTRIC CONSTANT COMPOSITIONS

[75] Inventor: Ian Burn, Hockessin, Del.

[73] Assignee: E. I. Du Pont de Nemours and Company, Wilmington, Del.

[21] Appl. No.: 236,072

[22] Filed: Aug. 23, 1988

Related U.S. Application Data

[63] Continuation-in-part of Ser. No. 3,259, Jan. 13, 1987, Pat. No. 4,766,027.

[51] Int. Cl.$^4$ ............................................. C03C 14/00
[52] U.S. Cl. ........................................ 501/32; 501/17; 501/49; 501/52; 501/65; 501/67; 501/133; 501/154
[58] Field of Search ..................... 501/17, 32, 49, 52, 501/65, 67, 133, 154

[56] References Cited

U.S. PATENT DOCUMENTS

| | | | |
|---|---|---|---|
| 4,624,934 | 11/1986 | Kokubu et al. | 501/67 X |
| 4,654,095 | 3/1987 | Steinberg | 501/133 X |
| 4,655,864 | 4/1987 | Rellick | 501/133 X |
| 4,752,531 | 6/1988 | Steinberg | 501/133 X |

FOREIGN PATENT DOCUMENTS

| | | | |
|---|---|---|---|
| 0099768 | 8/1978 | Japan | 501/32 |
| 480659 | 8/1975 | U.S.S.R. | 501/32 |

*Primary Examiner*—Mark L. Bell
*Assistant Examiner*—Karl Group

[57] ABSTRACT

An alkali-free composition for making a ceramic dielectric body having a dielectric constant less than 5.0, which is a mixture of finely divided particles consisting essentially of 70–85% wt. silica and 15–30% wt. zinc borate flux. This composition can be used to make green tape and multilayer devices having internal copper conductors such as multilayer capacitors and multilayer interconnects.

8 Claims, No Drawings

LOW DIELECTRIC CONSTANT COMPOSITIONS

CROSS REFERENCE TO RELATED APPLICATION

This application is a continuation-in-part of allowed copending U.S. patent application Ser. No. 07/003,259, filed Jan. 13, 1987 U.S. Pat. No. 4,766,027.

FIELD OF THE INVENTION

The invention relates to dielectric compositions and particularly to dielectric compositions with a low glass content and a dielectric constant below 5.0.

BACKGROUND OF THE INVENTION

Active electronic components such as integrated circuits (I.C.'s) on chips of silicon or gallium arsenide, and electro-optic switches or modulators, such as those based on lithium niobate or potassium titanophosphate (KTP) need to have electrical connections and to be mounted in a protective package. While polymeric multilayer substrates are widely used for mounting I.C.'s and providing the necessary interconnective circuitry, ceramic materials, particularly those based on aluminum oxide, are used in applications requiring the highest reliability. In some instances the I.C. is placed inside an alumina module (i.e. chip carrier) which is then mounted with electrical connection (e.g. by soldering) onto a multilayer ceramic substrate on which other components such as additional I.C.'s and/or capacitors and resistors are also attached. In other cases the bare chip is mounted directly onto the multilayer substrate and electrically connected (e.g. by wire bonding) before the complete circuit is encapsulated.

Multilayer ceramic substrates with internally connected metal conductors are well known in the prior art. In general, such structures are formed from ceramic green sheets prepared from suspensions of ceramic powders dispersed in thermoplastic polymer and solvent. Conductors are deposited on some of the green sheets in a pattern, usually by screen printing a paste consisting of a metal powder (preferably one with high electrical conductivity, such as copper), an organic binder and solvent. The sheets with conductors on them may also have via or feed-through holes punched in them to be filled with metal paste, as may be required for interconnections between layers in the final multilayer structure. This structure is then fired to drive off the organic binders and to sinter the ceramic and metal particulates.

The ceramic material used for the substrate must not only have adequate mechanical strength and the ability to dissipate the heat generated during operation of the circuit, but its expansion coefficient must match quite closely the expansion coefficient of the active device, or that of the alumina chip carrier depending on the method of mounting the device. In addition, because many circuits must operate at very high frequencies or signal speeds, the dielectric constant, K, of the ceramic must be as low as possible to minimize coupling between adjacent signal lines (i.e. crosstalk). Furthermore, in order to utilize the high performance of copper conductors within the substrate, the composition of the ceramic must be such that it can be sintered into a dense hermetic dielectric at a temperature below the melting point of Cu (1083° C.) and it must also be resistant to chemical reduction in the atmospheres of low oxygen content that are needed to prevent oxidation of the copper when the substrate is being fired.

Another application for low K dielectrics which can be cofired with copper conductors is in multilayer ceramic capacitors designed for use at high frequencies. A low dielectric constant makes it easier to achieve the precise capacitance tolerance needed for tuner applications. In addition, for a particular capacitance, more dielectric and conductor layers are needed with a low K dielectric because the conductor layers are connected in parallel; this lowers the series resistance of the capacitor leading to sharper resonance (high Q) at high frequencies. Use of copper conductors can also provide high Q because of low conductor resistance.

The present invention addresses the need for improved low K ceramic materials which can be used in ceramic multilayer structures with copper conductors.

PRIOR ART

A method for producing a multilayer ceramic circuit board for use with copper conductors is described in U.S. Pat. No. 4,642,148. Ceramic compositions comprising, in parts by weight, 10–75% alpha-alumina, 5–70% non-crystalline quartz, 20–60% borosilicate glass are disclosed. Dielectric constant with 33.3% of each component was 4.9.

U.S. Pat. No. 4,672,152 describes a multilayer ceramic circuit board in which the ceramic is prepared from a mixture of 50–95 wt % crystallizable glass and 5–50% ceramic filler. The crystallizable glass consists of 5–20 wt % lithium oxide, 60–90% silicon dioxide, 1–10% aluminum oxide, and 1–5% alkaline metal oxide other than lithium oxide. The ceramic filler is selected from the group of silicon dioxide, betaeucryptite, and aluminium oxide.

Japanese Pat. No. 62 46,937 to Shimizu et al. also describes ceramic compositions with low dielectric constants for use in multilayered printed circuit boards. The compositions comprise 20–70 wt % silica powder selected from alpha quartz, tridymite, cristobalite, and/or quartz glass together with 30–80% zinc borosilicate glass. These compositions may be laminated with various conductors, including copper.

Japanese Pat. No. 62 138,357 discloses ceramic compositions comprising 27–50 wt % powdered silica, 38–60% zinc borosilicate glass, and 1–25 wt % alumina. The material can be used for producing a multilayer printed circuit board. It is claimed that the alumina additions increase mechanical strength.

SUMMARY OF THE INVENTION

The invention is directed to an alkali-free composition for making a ceramic dielectric body with a low glass content and a dielectric constant, K, less than 5.0. In its primary aspect, the composition comprises an admixture of finely divided particles consisting essentially of:
  (a) 70–85% wt. silica and
  (b) 15–30% wt. zinc borate flux.

In a second aspect, the invention is directed to an unfired green tape comprising the above composition dispersed in a polymeric binder.

In a further aspect, the invention is directed to a multilayer ceramic substrate comprising layers of the above composition and interconnected conductor layers of copper therebetween, the assemblage having been fired to form a dense hermetic structure.

In a final aspect, the invention is directed to a multilayer ceramic capacitor comprising layers of the above composition with conductor layers of copper therebetween, the assemblage having been fired to form a dense hermetic structure.

DETAILED DESCRIPTION OF THE INVENTION

Alkali metal ions are excluded from the composition of the invention because their presence can compromise the reliability of the final multilayer structure. That is, alkali ions are very prone to electrolytic migration under conditions of high humidity and high voltage and this migration leads to shorting of the structure. In spite of the absence of alkali ions, which are well known for their fluxing action, low levels of flux are needed in the present invention. This leads to a low dielectric constant and is expected to have a beneficial influence on thermal conductivity and mechanical strength.

Silica

The silica may be crystalline and/or amorphous. For example, any of the six forms of crystalline silica may be used. Most preferred is alpha-quartz.

To obtain optimum dielectric properties, the silica should be pure. A purity of at least 99% wt. silica is particularly advantageous, although less pure forms are acceptable. The silica is present in the form of finely divided particles. Preferably, the crystalline silica particles are about 1-5 microns in size ($D_{50}$). Most preferably, the crystalline silica particles are 1-2 microns. Amorphous silica particles are preferably 0.4-6 microns.

The proportion of crystalline and amorphous silica is adjusted to produce a dielectric with the required thermal expansion coefficient, usually in the range of about 1.5 to 8.5 ppm/°C. Compositions with higher levels of crystalline silica have higher thermal expansion coefficients than compositions with lower levels of crystalline silica.

Zinc Borate Flux

The zinc borate flux enhances the sintering of the silica particles in order to achieve a dense hermetic dielectric when fired below the melting point of copper, 1083° C. Inadequate densification will result if less than 15% wt. flux is present in the composition. Above 30% wt. flux, no advantage is realized in terms of densification and other properties such as thermal conductivity, mechanical strength and the dissipation factor can degrade.

Zinc oxide and boron oxide are the main constituents of the zinc borate flux. Alumina may be present in an amount up to 50% molar of the boron oxide. Additionally, minor amounts of calcium, magnesium or barium may also be present.

When the flux does not contain alumina, the molar ratio of zinc oxide to boron oxide may be in the range of about 3/1 to 1/1. Preferably, the molar ratio is 2/1. When alumina is present in the flux, the molar ratio of zinc oxide to boron oxide may be in the range of about 4.5/1 to 1.5/1. The molar ratio of 3/1 in the absence of alumina and 4.5/1 in the presence of alumina represents the maximum ratio of zinc oxide that will react with boron oxide to produce the single phase product, zinc borate. Conversely, the molar ratio of 1/1 in the absence of alumina and 1.5/1 in the presence of alumina represents the maximum ratio of boron oxide that will react with zinc oxide to produce the single phase product, zinc borate.

One process for producing the zinc borate flux of the invention involves mixing boric acid and optionally, alumina, with zinc oxide. This mixture is milled in an organic medium with zirconia media and dried. The dried composition is calcined at an elevated temperature, e.g. 400°-800° C., and milled to the desired particle size.

Green Tape Casting Solution

Green tapes of the invention are made by casting a dispersion of the dielectric material, the silica and zinc borate flux, in a solution of polymeric binder and volatile organic solvent onto a flexible substrate, such as a steel belt or polymeric film, and then heating the cast layer to remove the volatile solvent therefrom.

The organic medium in which the ceramic solids are dispersed consists of the polymeric binder which is dissolved in a volatile organic solvent and optionally, other dissolved materials such as plasticizers, release agents, dispersing agents, stripping agents, antifouling agents and wetting agents.

To obtain better binding efficiency, it is preferred to use at least 5% wt. polymer binder for 95% wt. dielectric solids. However, it is further preferred to use no more than 20% wt. polymer binder in 80% wt. dielectric solids. Within these limits, it is desirable to use the least possible amount of binder vis-a-vis solids in order to reduce the amount of organics which must be removed by pyrolysis.

In the past, various polymeric materials have been employed as the binder for green tapes, e.g., (poly) vinyl butyral, (poly) vinyl acetate, (poly) vinyl alcohol, cellulosic polymers such as methyl cellulose, ethyl cellulose, hydroxyethyl cellulose, methylhydroxyethyl cellulose, atactic polypropylene, polyethylene, silicon polymers such as (poly) methyl siloxane, (poly) methylphenyl siloxane, polystyrene, (poly) vinyl phyrollidone, polyamides, high molecular weight polyethers, copolymers of ethylene oxide and propylene oxide, polyacrylamides, and various acrylic polymers such as sodium polyacrylate, (poly) lower alkyl acrylates, (poly) lower alkyl methacrylates and various copolymers and multipolymers of lower alkyl acrylates and methacrylates. Copolymers of ethyl methacrylate and methyl acrylate and terpolymers of ethyl acrylate, methyl methacrylate and methacrylic acid have been used previously as binders for slip casting materials.

More recently, Usala, in U.S. Pat. No. 4,613,648 has disclosed an organic binder which is a mixture of compatible multipolymers of 0-100% wt.$C_{1-8}$ alkyl acrylate and 0-5% wt. ethylenically unsaturated carboxylic acid or amine. Because the polymers permit the use of minimum amounts of binder and maximum amounts of dielectric solids, their use is preferred with the dielectric composition of this invention.

The solvent component of the casting solution is chosen so as to obtain complete solution of the polymer and sufficiently high volatility to enable the solvent to be evaporated from the dispersion by the application of relatively low levels of heat at atmospheric pressure. In addition, the solvent must boil well below the boiling point and decomposition temperature of any other additives contained in the organic medium. Thus, solvents having atmospheric boiling points below 150° C. are used most frequently. Such solvents include benzene, acetone, xylene, methanol, ethanol, methyl ethyl ketone, 1,1,1,-trichloroethane, tetrachloroethylene, amyl acetate, 2,2,4-triethyl pentandiol-1,3-monoisobutyrate, toluene and methylene chloride.

Frequently, the organic medium will also contain a small amount, relative to the binder polymer, of a plasticizer which serves to lower the glass transition temperature (Tg) of the binder polymer. However, the use of such materials should be minimized in order to reduce the amount of organic materials which must be removed when the films cast therefrom are fired. The choice of plasticizers is, of course, determined primarily by the polymer which must be modified. Among the plasticizers which have been used in various binder systems are diethyl phthalate, dibutyl phthalate, octyl phthalate, butyl benzyl phthalate, alkyl phosphates, polyalkylene glycols, glycerol, (poly) ethylene oxides, hydroxyethylated alkyl phenol, dialkyldithiophosphonate and (poly) isobutylene. Of these, butyl benzyl phthalate is most frequently used in acrylic polymer systems because it can be used effectively in relatively small concentrations.

Conductive Paste

Green tape and a conductive paste can be used to form multilayer electrically conductive devices. The conductive paste is a thick film copper conductive paste comprising finely divided particles of copper metal dispersed in a liquid organic medium comprising a noncellulosic polymer binder dissolved in an organic solvent which is a nonsolvent for the polymer binder in the adjacent green sheets with which it is used. Ethyl cellulose has been used in the past as the binder in conductive pastes. However, it has been discovered that when ethyl cellulose in the conductive paste is replaced by an appropriate acrylic binder, good conductor continuity and uniformity can be achieved even in multilayer structures with as many as 25 layers of copper each separate by as little as 25 microns of ceramic. This discovery is disclosed further in copending U.S. patent application Ser. No. 07/003259, filed Jan. 13, 1987, which is incorporated herein by reference.

A major difficulty of using non-cellulosic binders, such as acrylates, for screen printable electrode pastes is that the solvent reacts with the green tape. Also the paste sticks to the screen, and/or flows excessively unless low binder levels are used. At low binder levels, the solids content of the paste is high and the print deposit is usually too thick, leading to problems with nonuniform shrinkage of the multilayer ceramic structure. These problems have been solved in one instance, by formulating the paste with a poor solvent for acrylics, such as $\beta$-terpineol. The methyl methacrylates such as Elvacite® 2041, 2010 and 2008 manufactured by E. I. du Pont de Nemours and Company cannot be dissolved in $\beta$-terpineol even at concentrations as low as 10% by weight. However, it was found that the butyl methacrylate Elvacite® 2044 was readily soluble in the 20-30 wt. % concentration range. Hence, a conductive paste can be formulated by dissolving the n-butyl methacrylate polymer in terpineol (20/80 by wt.) and then blending a fine copper powder of about 1 micron particle size, preferably with a suitable surfactant to improve dispersion stability. The blend is then roll milled or mulled to complete the dispersion. When made at a metal loading of 55% by weight and used with a 400-mesh screen, excellent conductor uniformity at very thin layers ($\approx$2.5 microns) was achieved in fired multilayer ceramic capacitors with many conductors.

Multilayer Capacitors and Interconnects

A multilayer capacitor, MLC, is a multilayer device comprising a plurality of dielectric layers having conductor layers therebetween. MLC's are fabricated by various methods known in the art. Preferably, the MLC's of the invention are fabricated by printing conductive copper paste in the desired pattern upon a green tape laminated and cut to form the desired capacitor structures. These structures are then fired.

A multilayer interconnect, MLI, is a multilayer device comprising a plurality of dielectric layers with interconnected conductor layers therebetween. MLI's also are fabricated by various methods known in the art. Preferably, the MLI's of the invention are fabricated by printing conductive copper paste in the desired pattern upon a green tape substrate. Vias for interconnecting the conductive layers are punched into the green tape and filled with via-fill conductive paste. Preferably, the via-fill conductive paste comprises the raw materials of the conductive copper paste described previously but formulated with a higher solids content, such as 85-90% wt. metal. The patterned and via-filled green tape is stacked and laminated. Then, the entire assemblage is fired.

Firing Process

The foregoing multilayer devices with internal copper conductors are fired in a commercial furnace (e.g. Cladan, Inc.) which has been specially sealed to contain a controlled atmosphere without significant leakage. Use of atmospheres with low oxygen content for firing multilayer green structures with base metal electrodes is well known. Atmospheres of $N_2$, $H_2O+H_2$, $CO+CO_2+N_2$ have been described, and a variety of other atmospheres including $H_2+H_2O+N_2$, and $CO_2+H_2+N_2$ can be used. Preferably, $CO_2+H_2+N_2$ is used because of the atmosphere control provided by such a mixture, and for safety reasons: nonexplosive levels of $H_2$ are needed, and the storage and piping of carbon monoxide are not required.

The green multilayer devices can be prefired at 400° C. in $N_2$ to remove most of the organic binders or they can be sintered directly without prefiring. A convenient heating rate is 25° C./minute to 750° C., decreasing to 10° C./minute to 1050° C. The optimal rate will depend upon the size of the device being fired. Larger devices require slower rates. The soak period is usually 1-2 hours at 1000° C.-1075° C., and then the furnace is cooled at its natural rate. A gas mixture of nitrogen, carbon dioxide, and hydrogen circulates through the furnace during the entire cycle (heating and cooling) at a flow rate adequate to maintain a slight positive pressure. The ratio of carbon dioxide to hydrogen determines the oxygen partial pressure. The ratio should be kept between about 10/1 and 50/1. If the atmosphere is too reducing (ratio of $CO_2/H_2$ is too low), then delamination of the multilayer device is more likely to occur due to premature sintering of the copper conductors. If the ratio is too high, the copper conductors will partially oxidize and can react excessively with, or dissolve into the ceramic dielectric. A slight reaction between the conductors and ceramic dielectric can be beneficial to good bonding but should be minimized to avoid variations in properties for differing ceramic thicknesses and numbers of conductors.

EXAMPLES

The following properties which are relevant to the ability of a given capacitor or interconnect to function properly are referred to in the following examples:

Capacitance is a measure of the capability of a material to store an electrical charge. The units of capacitance are farads or fractions thereof such as microfarads ($10^{-6}$ farad), nanofarads ($10^{-9}$ farad) or picofarads ($10^{-2}$ farad).

Dissipation Factor (DF) is a measure of the phase difference between voltage and current. In a perfect capacitor the phase difference would be 90°. However, in practical dielectric systems, this phase difference is less than 90° by an amount $\sigma$ because of leakage and relaxation losses. In particular, DF is the tangent of the angle $\sigma$. Q is the reciprocal of DF. Capacitance and dissipation factors were measured using a Hewlett Packard 4192A impedance analyzer.

Insulation Resistance (IR) is a measure of the ability of a charged capacitor to withstand leakage in DC current. Insulation resistance expressed as ohm farads ($\Omega F$) is a constant for any given dielectric regardless of capacitance. 1 K. ohm. farad is 1000 ohm. farads. Insulation resistance was measured using a Hewlett-Packard 4140B pA meter after charging the capacitor for 2 minutes with 100 VDC applied.

Thermal Coefficient of Expansion (TCE) is a measure of the change in size of an object as a function of temperature. Typical units are ppm/°C. or cm/cm/°C. Thermal coefficient of expansion was measured using a Netzsch dilatometer.

Dielectric Constant (K). The thickness and area of the dielectric layers were measured using polished sections of the capacitors and optical microscopy. The dielectric constant was calculated using the equation:

$$K = \frac{C}{A} \cdot \frac{T}{N}$$

where
- C is the capacitance of the capacitor;
- A is the electrode area in contact with the dielectric layer;
- T is the thickness of the dielectric layer;
- N is the number of dielectric layers.

EXAMPLE 1

A zinc borate flux of molar composition $2ZnO.B_2O_3$ was prepared in the following way. A mix of 150.0 gms of boric acid (Fisher Chem.) and 197.4 gms of zinc oxide (Baker Chem.) was milled 5 hours in 175 gms of isopropyl alcohol with zirconia media and then dried overnight. It was calcined at 700° C. for 5 hours and then milled 16 hours to a particle size ($D_{50}$) of about 1 micron. Ceramic tape was made from a slurry prepared by mixing 10.0 gms of zinc borate flux with 35.0 gms silica powder (Imsil A-108, Illinois Minerals Co.) and 66.0 gms of Du Pont 5200 binder solution. The binder solution consisted of 8.5 parts (by weight) acrylic polymer in 19.8 parts MEK (methyl ethyl ketone), 2.0 parts butyl benzyl pthalate plasticizer, 1.5 parts of a 10% solution of Poly-Pale® resin, a partially polymerized resin, (Hercules, Inc., Wilmington, Del.) in isopropanol, and 68.2 parts 1-1-1 trichloroethane. The green ceramic tape was cast at a thickness of about 35 microns (dry).

Multilayer ceramic capacitors of size 1209 were assembled with 6 layers of green tape with electrodes printed on each layer, and cover plates of eight layers of green tape on the top and bottom. The electrodes were printed using a copper paste prepared from 55 parts by weight copper powder (Powder #10, Metz Metallurgical Corp., South Plainfield, N.J.), 44.5 parts of a 20% solution of butyl methacrylate resin (Elvacite® 2044, Du Pont Co., Wilmington, Del.), and 0.5 parts of phosphate ester surfactant (RK-500, GAF Corp., New York, N.Y.). The multilayer structures were laminated at 8000 psi.

The green MLC's were fired by heating in an atmosphere of nitrogen, hydrogen and carbon dioxide. The hydrogen was a 4% mixture in nitrogen, and a carbon dioxide/ hydrogen ratio of 50/1 was used. The total nitrogen level was about 3 times the amount of carbon dioxide. The furnace was heated to 750° C. in 30 minutes and then to 1065 in a further 30 minutes. A maximum temperature of 1065° C. was maintained for 150 minutes during which the oxygen level in the furnace was approximately $10^{-9}$ atmospheres as indicated by an in situ zirconia oxygen sensor. The furnace was cooled at its natural rate and the hydrogen/carbon dioxide mixture switched off when the temperature had dropped below 500° C.

The multilayer capacitors were terminated using Du Pont 7001D copper termination paste (Du Pont Co., Wilmington, Del.) which was fired on at 700° C. in nitrogen. Electrical measurements were made with a Hewlett Packard 4192A impedance analyzer and a Hewlett Packard 4140B picoammeter. Capacitance was 43.1 to 48.7 picofarads and dissipation factor was 0.11% at 1 kHz. Insulation resistance was 2500 to 10600 ohm. farads, i.e. $>10^{13}$ ohms, with 100 V applied. Microscopy of polished sections of the capacitors showed them to be dense (no connected porosity). The Cu internal electrodes had good uniformity with no sign of delamination. The dielectric constant was calculated to be 4.2 +/−0.2.

EXAMPLE 2

In this example some of the boron oxide in the flux was replaced by alumina. The flux had the molar composition $6ZnO.2B_2O_3.Al_2O_3$ and was prepared by blending 119.72 gms of zinc oxide with 60.65 gms of boric acid and 25.00 gms of fumed alumina (Degussa Corp.). These ingredients were milled and calcined as described above.

Green tape was made with 35 parts by weight Imsil silica to 15 parts zinc aluminoborate flux and this was made into MLC's with copper electrodes as described above. The alumina content of the fired ceramic was calculated to be 4.2%.

Capacitance of the finished MLC's was 40.8 to 43.5 picofarads and dissipation factor was 0.1 to 0.3% at 1 kHz. Insulation resistance was 2600 to 9400 ohm. farads and K was calculated to be 3.9+/−0.1.

EXAMPLE 3

In this example green tape was made and processed into a multilayer interconnect (MLI) test substrate with internal copper conductors.

A ceramic slurry was made from 105 gms of noncrystalline silica powder with particle size about 6 microns (FQ066, Industrial Corp., Naples, Fla.) and 45 gms of zinc borate flux. The zinc borate flux was made as in Example 1 but calcined at 600° C. instead of 700° C. to minimize the amount of milling needed. In this example the powders were milled overnight in 75.0 gms of 1-1-1 trichloroethane with 1.5 gms soya lethecin (as a surfactant) and then 57 gms binder solution added and blended for 30 minutes. The binder solution was 91.7% acrylic resin in MEK (5200 Binder, Du Pont Co., Wilmington, Del.) and 8.3% butyl benzyl pthalate plasticizer. Green tape was cast from the slurry approximately 250 microns thick when dried.

Multilayer ceramic substrates were made with eight layers of ceramic tape and 3 internal conductor layers. The copper conductor paste was made as in Example 1. The conductor layers and the top layer of the substrate were interconnected with vias using copper via-fill paste. The via-fill paste was made with the same raw materials as the electrode paste but was formulated to a higher solids content (88% metal). The layers of tape were laminated at 70° C. at 3000 psi for 10 minutes. The laminates were trimmed and then fired as described for the MLC's of Example 1.

Flat, hermetic, substrates 4.7×4.7 cm in area were obtained after firing. The inner layers of ceramic were 155 microns thick. Test capacitors within the substrate had a capacitance of 21 picofarads with a dissipation factor of 0.05% or lower at 1 kHz. The calculated K averaged 4.4.

EXAMPLES 4, 5, 6, 7

These examples illustrate how the thermal expansion coefficient can be adjusted by varying the relative proportions of crystalline and non-crystalline silica in the composition.

The flux and non-crystalline silica of Example 3 were used together with various amounts of alpha-quartz. The alpha-quartz (Silver Bond B, Tamms Industries Co.) was milled to a particle size of approximately 2.0 microns. Green tape was made and pressed into bars which were about 20×6×3 mm in size after firing as described above. These bars were then used to measure thermal expansion coefficient using a Netzsch dilatometer. Data averaged for the temperature range 200°–300° C. are given in Table 1. It can be seen the compositions of the present invention cover the range of expansion coefficient needed to match, for example, silicon (3.5 ppm/°C.), gallium arsenide (6.5 ppm/°C.), alumina (7 ppm/°C.), or KTP (8.5 ppm/°C.).

TABLE 1

| Example | quartz (wt %) | non-crystalline silica | zinc borate flux | TCE ppm/°C. |
|---|---|---|---|---|
| 4 | 0 | 70.0 | 30.0 | 1.5 |
| 5 | 17.5 | 52.5 | 30.0 | 3.0 |
| 6 | 35.0 | 35.0 | 30.0 | 5.0 |
| 7 | 52.5 | 17.5 | 30.0 | 6.5 |

EXAMPLE 8

This example illustrates both an alternative method of processing the materials to make substrates and the use of submicron amorphous silica particles.

Fine quartz powder was prepared by ball-milling Min-U-sil #5 (Pennsylvania Glass Sand Corp., New York, N.Y.), silica, to a particle size ($D_{50}$) of 1.6 microns. Amorphous silica particles were prepared by precipitation from tetraorthosilicate using the well known Stober method. The particles were close to monosize at about 0.4 microns. These powders were blended with the zinc borate flux described in Example 3 in the following amounts: 33.75 gms quartz, 3.75 gms amorphous silica, and 12.5 gms zinc borate flux. These powders were milled 16 hrs in 25 gms 1-1-1 trichloroethane with 1.25 gms of AB 1020 surfactant (Du Pont Co., Wilmington, Del.), and then 19 gms of the binder described in Example 3 were added and milling continued for an additional 5 hours.

Tape was cast as before and laminated into a test substrate without electrodes. The substrate was 4.2×4.2 cm in area after firing. Firing was carried out as before except that a bake-out step at 400° C. for 30 minutes in nitrogen was done first. Also the heating rate to the firing temperature (1065° C.) was slowed by ramping the furnace at a linear rate over a period of 3 hours. A slower heating rate was found necessary to prevent cracking in substrates that had a high quartz content. The fired ceramic was very dense with no surface staining when subjected to a dye test.

I claim:

1. An alkali-free composition for forming a ceramic dielectric body having a dielectric constant less than 5.0, which is a mixture of finely divided particles consisting essentially of:
   (a) 70–85% by weight silica particles and
   (b) 15–30% by weight zinc borate flux particles.

2. The composition of claim 1 wherein the zinc borate flux consists essentially of zinc oxide and boron oxide and the mole ratio of zinc oxide to boron oxide is in the range of 3/1 to 1/1.

3. The composition of claim 2 wherein the mole ratio of zinc oxide to boron oxide is 2/1 in the zinc borate flux.

4. The composition of claim 1 wherein the silica is alpha-quartz.

5. The composition of claim 1 wherein the formed ceramic dielectric body has a thermal coefficient of expansion in the range of 1.5 to 8.5 ppm/°C.

6. The composition of claim 1 in which the mixture of finely divided particles is dispersed in an organic medium.

7. The composition of claim 6 in which the organic medium is comprised of a polymeric binder dissolved in organic solvent.

8. The composition of claim 7 in which the organic solvent is a volatile solvent and the dispersion is of castable consistency.

* * * * *